United States Patent
Kasamsetty

(10) Patent No.: US 7,136,310 B2
(45) Date of Patent: Nov. 14, 2006

(54) PROGRAMMABLE OUTPUT DRIVER TURN-ON TIME FOR AN INTEGRATED CIRCUIT MEMORY DEVICE

(75) Inventor: Kishore Kasamsetty, Cupertino, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 11/023,274

(22) Filed: Dec. 27, 2004

(65) Prior Publication Data
US 2006/0140015 A1   Jun. 29, 2006

(51) Int. Cl.
*G11C 7/00* (2006.01)

(52) U.S. Cl. .............................. 365/189.05; 365/189.03

(58) Field of Classification Search ............ 365/189.05
See application file for complete search history.

(56) References Cited

U.S. PATENT DOCUMENTS

| | | |
|---|---|---|
| 4,797,573 A | 1/1989 | Ishimoto |
| 6,275,077 B1 | 8/2001 | Tobin et al. |
| 6,330,196 B1 | 12/2001 | Protzman |
| 6,426,916 B1 * | 7/2002 | Farmwald et al. .......... 365/233 |
| 6,442,644 B1 | 8/2002 | Gustavson et al. |
| 6,556,492 B1 | 4/2003 | Ernst et al. |
| 6,727,733 B1 | 4/2004 | Klein |
| 6,762,625 B1 | 7/2004 | Devnath |
| 6,771,106 B1 | 8/2004 | Krasnansky |
| 6,785,858 B1 * | 8/2004 | Niiro .......................... 714/744 |

\* cited by examiner

*Primary Examiner*—Thong Q. Le
(74) *Attorney, Agent, or Firm*—Vierra Magen Marcus & DeNiro LLP

(57) ABSTRACT

An integrated circuit memory device, system and method turns on an output driver in response to a stored value that represents an amount of time from when the output driver is in an operational state to when the output driver begins to output valid read data in various embodiments. An output driver outputs valid read data after a settling amount of time. The sum of the amount of time from when the memory device receives a read command to when the output driver is turned-on and the settling amount of time, is approximately the time from receiving the read command, to at least beginning to provide valid read data at the output of the integrated circuit memory device. A read command is provided to the integrated circuit memory device by a memory controller. In an embodiment, the memory controller also provides or programs the value that represents the amount of time from when the output driver is in an operational state to when the output driver begins to output valid read data.

16 Claims, 5 Drawing Sheets

PROGRAMMABLE OUTPUT DRIVER TURN-ON TIME FOR AN INTEGRATED CIRCUIT MEMORY DEVICE

FIELD OF THE INVENTION

The present invention generally relates to integrated circuit devices and/or high speed signaling in such devices.

BACKGROUND OF THE RELATED ART

An output driver of an integrated circuit, such as an integrated circuit memory device, often is enabled before outputting data in high speed signaling. For example, an output driver of a dynamic random access memory (DRAM) is enabled or turned-on at a fixed time before transferring data on a bidirectional data bus. Generally, a settling time is needed after enabling the operation of the output driver before accurate data may be output from the output driver. This settling time is needed to allow for power source, or power rail, fluctuations that occur after the enabling of the output driver to dissipate so that errors are not introduced into the intended output data.

However, an integrated circuit memory device may be included in a variety of environments or memory systems that are afflicted by varying degrees of power source noise or power source noise profiles. A number of factors may affect the amount of noise in these different systems. For example, the package type and number of input/output contacts or pins of an integrated circuit memory device may cause different noise profiles. Likewise, the position and number of integrated circuit memory devices on a memory module also affect the amount of noise. Also, the number of power supply contacts or pins may also contribute to noise.

In a noisy environment, it may be desirable to enable the output driver earlier than the fixed time so that more settling time is provided. Alternatively in less noisy environments, it may be desirable to enable the output driver later than the fixed time so that less settling time is provided and increased integrated circuit memory device performance or increased data rates may be achieved.

BRIEF DESCRIPTION OF THE DRAWING

The present invention is illustrated by way of example, and not by way of limitation, in the figures of the accompanying drawings and in which like reference numerals refer to similar elements in which.

DETAILED DESCRIPTION

An integrated circuit memory device, system and method include an output driver having a programmable settling time, in embodiments. For example, a register located on the memory device may store a settling time value that represents an amount of time from when the output driver is in an operational state (e.g., when the driver is enabled to operate) to when the output driver begins to output valid read data. In this embodiment, the output driver outputs valid read data after the settling time.

An enable time may represent a time interval between when the memory device receives a read command to when the output driver is enabled for operation. The sum of an enable time and the settling time approximately equals an amount of time from receiving a signal indicating a read operation for an integrated circuit memory device, such as a read command, to at least beginning to provide valid read data at an output of the integrated circuit memory device, (e.g., at a contact of the integrated circuit memory device). The read command may be provided to the integrated circuit memory device by a memory controller. In an embodiment, the memory controller also provides or programs the value that represents an amount of time from when the output driver is in an operational state to when the output driver begins to output valid read data.

Figure 1:
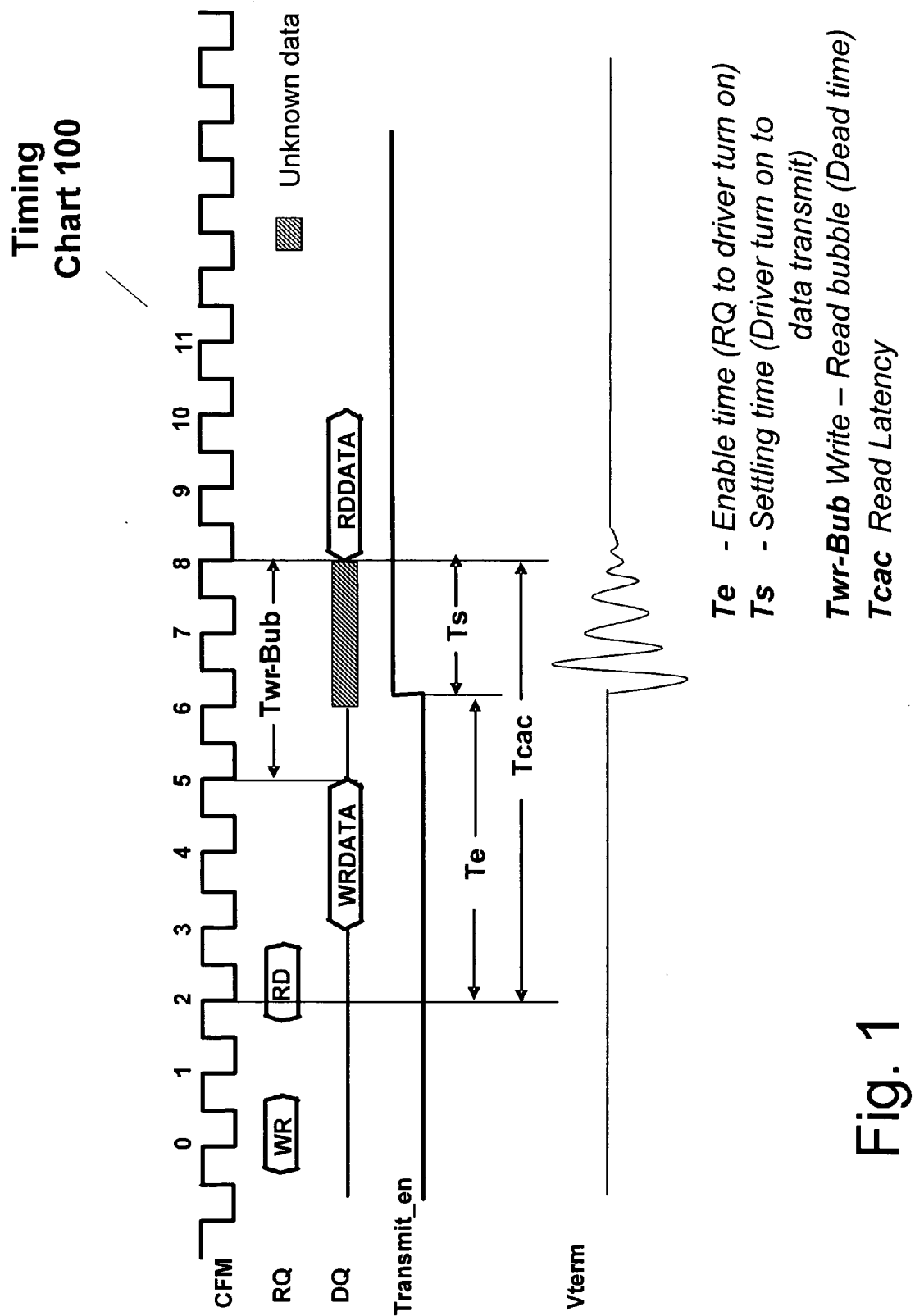
FIG. 1 is a timing chart 100 illustrating the enablement of an output driver of an integrated circuit memory device according to an embodiment.

FIG. 1 is a timing chart 100 illustrating a programmable output driver enable signal Transmit_en. Clock signals CFM illustrate clock cycles used in transferring write data WRDATA to an integrated circuit memory device (by way of interconnect DQ) and read data RDDATA from the integrated circuit memory device (by way of interconnect DQ). In an embodiment, clock signals CFM are provided by a clock source in a master device, such as master device 301, shown in FIG. 3. In alternate embodiments, the clock signals CFM may be provided from another source in a memory system, for example, a dedicated clock generator integrated circuit. In alternate embodiments, higher or lower clock frequencies of clock signals CFM are used.

In an embodiment, a write command WR (or other signal indicating a write operation) and a following read command RD (or other signal indicating a read operation) are provided on interconnect RQ to an integrated circuit memory device from a master device. In an embodiment, a write command WR is provided at a falling edge of clock cycle 0 and a read command is provided at a falling edge of clock cycle 2. In an embodiment, interconnect RQ is a control bus that is separate from interconnect DQ that may be a bidirectional data bus DQ. In an embodiment, a serial interconnect or bus is also coupled to an integrated circuit memory device and provides control values from the master device.

In an embodiment, a time interval Twr-Bub represents a write—read bubble time or dead time in which data is not transferred on bidirectional bus DQ. In this example, this time interval Twr-Bub occurs between transferring write data WRDATA to an integrated circuit memory device and read data RDDATA from the integrated circuit memory device on a bidirectional bus DQ.

In an embodiment, a time interval Tcac, (also known as a $T_{AC}$ time interval), represents an amount of time from receiving a signal indicating a read operation for an integrated circuit memory, such as a read command RD, to at least beginning to provide valid read data at an output of the integrated circuit memory device. The output of the integrated circuit device is a contact, such as a pin or a ball that interfaces signals with other components or integrated circuit devices incorporated with the memory device in a system.

In an embodiment, a time interval Tcac includes a time interval Te representing an amount of time from receiving a signal indicating a read operation to when an output driver is enabled (or turned-on) such that the output driver is in an operational state. In an embodiment, a time interval Te represents an amount of time from receiving a signal indicating a read operation for an integrated circuit memory device to an assertion of a signal that initiates the operation of an output driver of the integrated circuit memory device, such as illustrated by output driver enable signal Transmit_en. While FIG. 1 illustrates a transition of output driver enable signal Transmit_en from a low voltage (logic zero) to a high voltage (logic one), as one of ordinary skill in the art would appreciate, other signal transitions or logic may be used in alternate embodiments.

In an embodiment, a time interval Ts represents a settling time from enabling an output driver to the end of the time interval Tcac, such that Tcac=Te+Ts. In an embodiment, at the end of time interval Ts, valid data represented by a predetermined voltage may be output at a contact coupled to an output driver that has recently been turned-on. Voltage Vterm represents the noise or undesirable voltage at an output driver contact shortly after initiating the operation of the output driver during a time interval Tcac, and in particular during a settling time interval Ts.

Figure 2A:
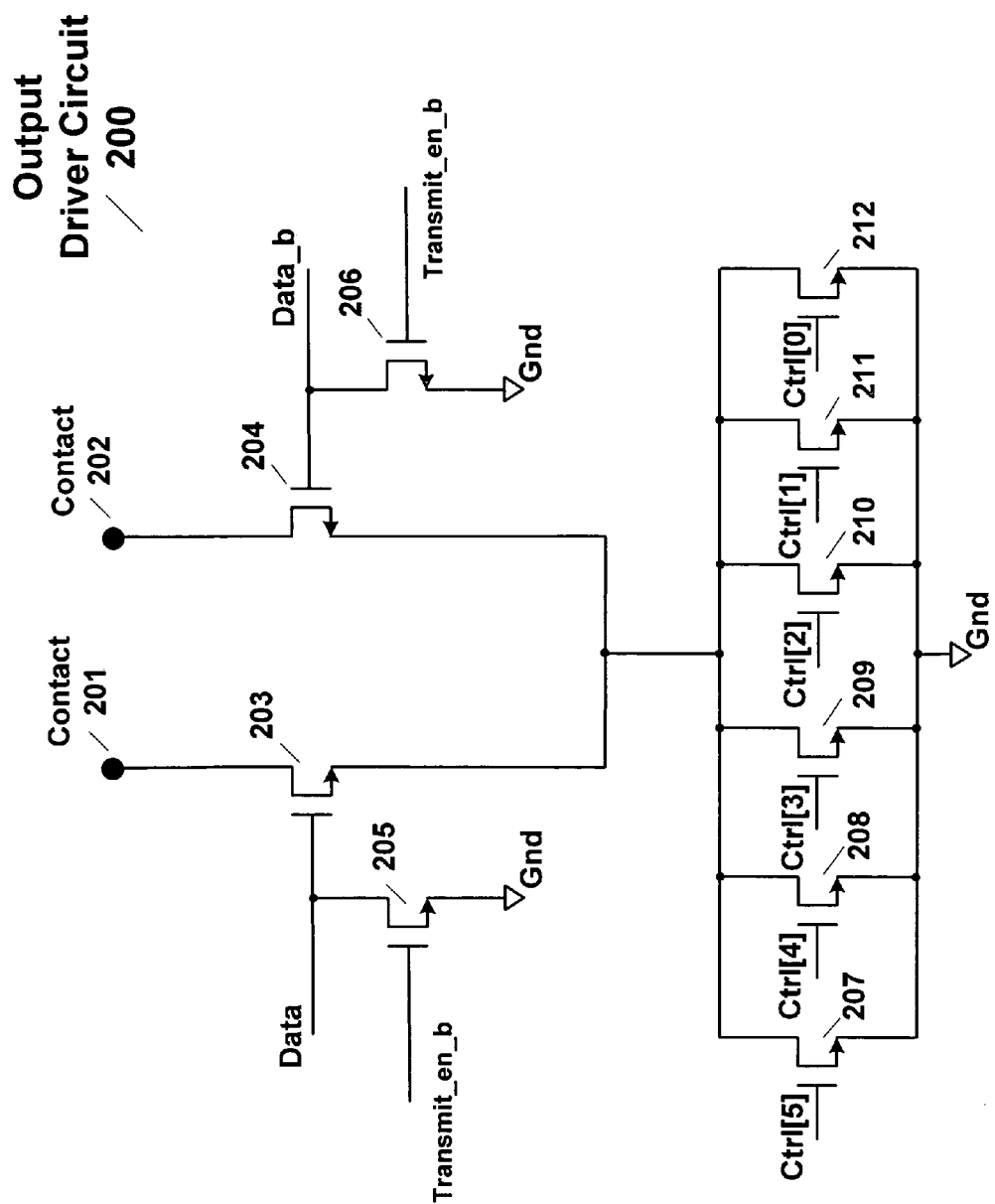
FIG. 2*a* is a schematic of an output driver circuit 200 according to an embodiment.

FIG. 2a is a schematic of an output driver circuit 200 according to an embodiment. As one of ordinary skill in the art would appreciate, output driver circuit 200 is exemplary and many other possible output driver designs or embodiments may be used. Contacts 201 and 202 are coupled to n-type transistors 203 and 204, in particular to the drains of transistors 203 and 204. In an embodiment, contacts 201 and 202 provide a predetermined differential voltage output representing data values. Voltage levels are output in response to Data and Data_b (a logic complement of a Data signal in an embodiment) signals provided to the gates of transistors 203 and 204 as long as Transmit_en_b is provided as described below. Sources of transistors 203 and 204 are coupled to a common current source including n-type transistors 207–212. The drains of transistors 207–212 are coupled to the sources of transistors 203 and 204. The sources of transistors 207–212 are coupled to a ground reference Gnd. In alternate embodiments, more or less transistors are used as a current source. Current control signals [1:5] are provided to respective gates of transistors 207–212 in order to control the amount of current provided by the current source. In an embodiment, current control signals [1:5] are provided to the output driver included in an integrated circuit memory device by a master device.

Figure 2B:
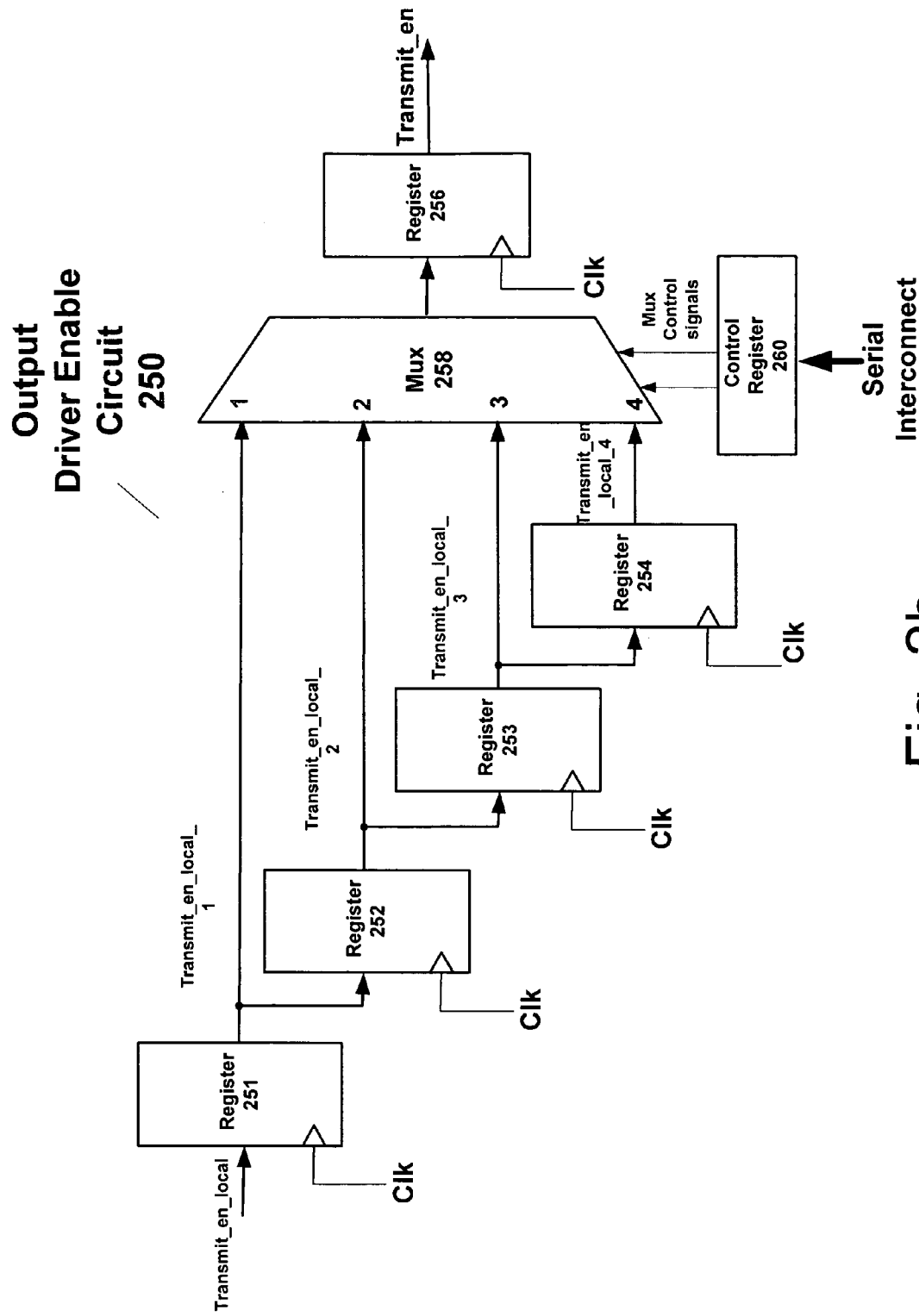
FIG. 2*b* is a schematic of an output driver enable circuit 250 according to an embodiment.

N-type transistors 205 and 206 enable the operation of output driver circuit 200 (or turn-on output driver circuit 200) in response to a pair of output enable signals Transmit_en_b (logic complements or an inverted output driver enable signal Transmit_en as shown in FIG. 1 and FIG. 2b) provided to the respective gates of transistors 205 and 206. Drains of n-type transistors 205 and 206 are coupled to the respective gates of transistors 203 and 204. The sources of n-type transistors 205 and 206 are coupled to a ground reference Gnd.

In alternate embodiments, other types of transistors are used in output driver circuit 200. For example, n-type transistors shown in FIG. 2a may be replaced with p-type transistors.

Figure 3:
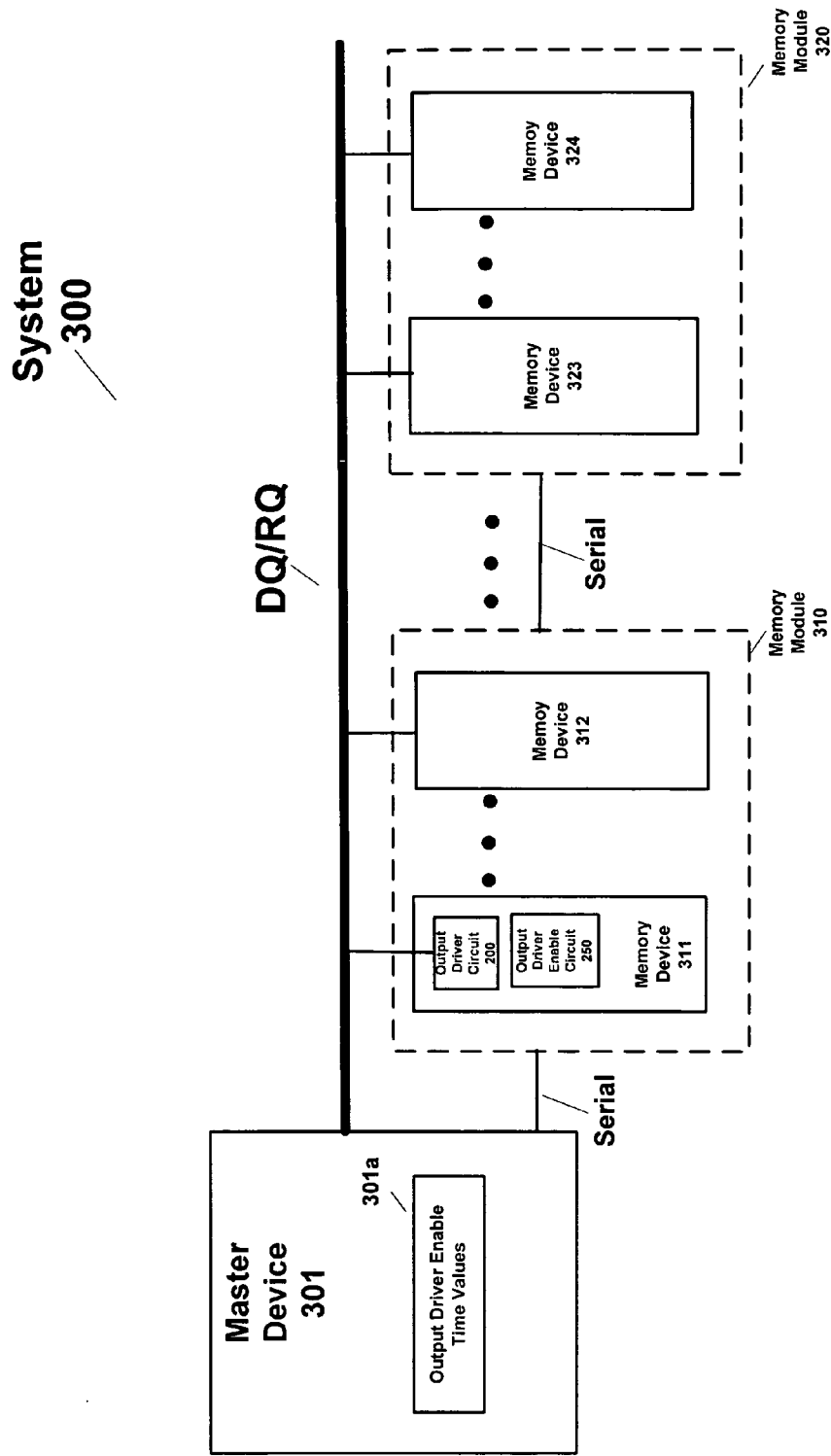
FIG. 3 illustrates a system 300 for enabling an output driver according to an embodiment.

Contacts 201 and 202 are used to transmit and/or receive signals to or from one or more integrated circuit devices, such as between master device 301 and an integrated circuit memory device 311 as seen in FIG. 3 and described below. Contacts 201 and 202 are used to output read data values in the form of predetermined voltage values from an integrated circuit memory device, in particular from data stored in a memory array of an integrated circuit memory device in an embodiment. Contacts 201 and 202 are one of many contacts in an embodiment. Contacts 201 and 202 are coupled to a master device by way of an interconnect DQ. In an embodiment of the present invention, contacts 201 and/or 202 includes a surface, pin, wire lead or solder ball, singly or in combination, to provide electrical connections between an integrated circuit memory device 311 and interconnect DQ.

In an alternate embodiment, a single ended output driver is used for output driver circuit 200 and is turned-on in response to a single output driver enable signal.

In an alternate embodiment, multiple output driver circuits 200 are used for multiple respective contacts or groups of contacts.

Signals described herein may be transmitted or received between and within devices by electrical conductors and generated using any number of signaling techniques including without limitation, modulating the voltage or current level of an electrical signal. The signals may represent any type of control and timing information (e.g. commands, address values, clock signals, and configuration information) as well as data. Also, a single signal illustrated may represent a plurality of signals on respective signal lines in an embodiment of the present invention.

FIG. 2b is a schematic of an exemplary output driver enable circuit 250 that provides a programmable output driver enable signal Transmit_en. Register 251 has an input for receiving an output driver enable signal Transmit_en_local and clock signal Clk. In an embodiment, clock signal Clk is clock signal CFM (clock from master device) in an embodiment. An internal clock signal which may be a frequency multiple or divisor of the clock signal CFM is generated (e.g., by way of a delay locked loop circuit or a phase locked loop) and used to synchronize or orchestrate timing events for the integrated circuit memory device in a system. Clock signal clk or the internal clock signal may be used to synchronize the output of data by the output driver circuit 200 such that the data is output synchronously with respect to the clock signal clk or the internal clock signal.

Register 251 outputs an output enable signal Transmit_en_local_1 (delayed by one clock cycle of signal Transmit_en local) to a first input of multiplexer ("mux") 258 and register 252, also having an input clock signal Clk. Register 252 outputs an output driver enable signal Transmit_en_local_2 (delayed by two clock cycles) to a second input of mux 258 and register 253, also having an input clock signal Clk. Register 253 outputs an output driver enable signal Transmit_en_local_3 (delayed by three clock cycles) to third input of mux 258 and register 254, also having an input clock signal Clk. Register 254 outputs an output driver enable signal Transmit_en_local_4 to a fourth input of mux 258 which also has an input clock signal Clk. Mux 258 is a 4:1 multiplexer and outputs an output driver enable signal Transmit_en to register 256 in response to mux control signals from control register 260. In an embodiment, an output driver enable signal Transmit_en is output from register 256 to an input of an inverter that provides output enable signal Transmit_en_b as shown in FIG. 2a.

In an embodiment, control register 260 stores a value that is a representation or indication of an amount of time from receiving a signal indicating a read operation to when output driver circuit 200 is enabled or turned-on. In this embodiment, the amount of time is expressed in terms of clock cycles of the clock signal clk. In embodiments, control register 260 is a 2-bit register and has a value provided during an output driver calibration mode. In an embodiment, a value is programmed or stored in control register 260 by a master device using a serial interconnect or bus.

Thus, an assertion of an output driver enable signal Transmit_en may be programmed (or when an output driver is turned-on) by selecting a desired delay or input of mux 258 by mux control signals from a control register 260, and in particular by bits of control register 260.

In an alternate embodiment, a serial presence detect (SPD) device may be used to determine the signals that generate mux control signals to mux 258. An SPD device is a non-volatile memory device that may be included on a memory module, such as a dual-inline memory module (DIMM), or elsewhere in system 300 embodiments described below. The SPD device stores information used by system 300 to properly configure system 300. In an embodiment, system 300 reads information from an SPD device and writes the information for when to turn-on an output driver to a control register positioned on a master device (which then may be transferred to an integrated circuit memory device) or integrated circuit memory device at system 300 initialization or power-up. In another embodiment, a calibration sequence may be used to determine the information pertaining to when the turn-on time of the output driver occurs.

The settling time of the memory device, or the enable time of the memory device may be stored on the SPD device. For example, the enable time and settling time may be expressed in terms of time units where a table of values map specific time units to specific binary codes. During an initialization sequence a memory controller may read one or both of the settling and enable times from the SPD device and determine the proper settling time value and enable time value to store on the memory device. For example, the memory controller may also read information representing the clock frequency of the clock signal clk from the SPD device, and divide the settling time and/or enable time by a clock period of the clock signal clk. (The clock period of the clock signal clk is the reciprocal of the clock frequency of the clock signal clk). Any remainder resulting from this division may be rounded up to the next whole number of clock cycles of the clock signal.

In an embodiment, mux control signals to mux 258 are provided in response to the execution of machine-readable instructions or software stored on or accessible from an integrated circuit memory device.

In an alternate embodiment, a value representing or indicating an amount of time before an output driver is turned-on is provided and stored in control register 260 by master device 301 using a serial interconnect. In an alternate embodiment, values are provided to control register 260 by master device 301 by using interconnect RQ. In an embodiment, master device 301 writes known test data to integrated circuit memory device 311 and reads the stored test data from the integrated circuit memory device 311. Based on a comparison between the test data written to and read from integrated circuit memory device 311, a value is provided to control register 260 during a calibration mode. In an alternate calibration mode embodiment, stored test data is read from integrated circuit memory device 311 and compared to stored test data in master device 301 and a value is provided to control register 260.

FIG. 3 illustrates a system 300 including a master device 301 and at least one integrated circuit memory device 311 that includes output driver circuit 200 and output driver enable circuit 250, as described above, in embodiments.

In an embodiment, integrated circuit memory devices 311, 312, 323 and 324 each have a plurality of storage cells, collectively referred to as a memory array. An integrated circuit memory device stores data (which may be retrieved) associated with a particular address provided, for example, as part of a write or read command. In an embodiment of the present invention, a write or read command is included in a signal from master device 301. An integrated circuit memory device typically includes request decode and array access logic that, among other functions, decodes request and address information, and controls memory transfers between a memory array and an integrated circuit memory device interface circuit. In an embodiment of the present invention, read data from a memory array is output on interconnect DQ to master device 301.

In an embodiment an integrated circuit memory device (e.g., a dynamic random access memory having an array of dynamic memory cells) includes a first register and a second register. The first register (e.g. a storage circuit) to store a first value that is representative of a number of clock cycles of a clock signal to transpire between receiving a read command and enabling an output driver for operation. The second register to store a second value that is representative of a number of clock cycles of the clock signal to transpire between receiving the read command and outputting valid data. Here the outputting the valid data occurs after the enabling the output driver for operation. A settling time occurs between when the output driver is enabled to when the valid data is output. The first and second values are stored in response to a command that specify loading the first register with the first value and loading the second register with the second value. In operation, the memory device receives the command at an interface of the memory device. The command that specifies loading may be multiplexed with other commands or address information using common interface resources or may include separate (e.g., dedicated or partially dedicated) interface resources, such as a pin or contact. In operation, the valid data is output in the form of a differential signal at two contacts.

Examples of types of integrated circuit memory devices include dynamic random access memory ("DRAM"), static random access memory ("SRAM"), double data rate SDRAM ("DDR"), Direct Rambus® memory ("DRDRAM"), "XDR™" memory devices, Ferroelectric RAM ("FRAM"), Magnetoresistive or Magnetic RAM ("MRAM"), Flash, or read-only memory ("ROM").

In an embodiment, a plurality of integrated circuit memory devices are included in a memory module, such as a dual-in-line-module (DIMM) that includes substrate structure having a plurality of memory devices employed with a connector interface that includes contacts. FIG. 3 illustrates integrated circuit memory devices 311 and 312 in a first memory module 310 and integrated circuit memory devices 323 and 324 in a second memory module 320.

In embodiments, master device 301 is a memory controller which may be an integrated circuit device that contains other interfaces or functionality, for example, a northbridge chip of a chip set. The memory controller may be integrated on a microprocessor or a graphics processor unit ("GPU") or visual processor unit ("VPU"). The memory controller may be implemented as a field programmable gate array ("FPGA"). The memory device and master device 301 may be included in various systems or subsystems such as personal computers, graphics cards, set-top box, cable modems, cell phones, game consoles, digital television sets (for example, high definition television ("HDTV")), fax machines, cable modems, digital versatile disc ("DVD") players or network routers.

In an embodiment, an interconnect, such as interconnect DQ, between or within devices is represented as a single signal line in the figures and represents a conductive element, wire or trace for transferring a signal between or within a device. In an alternate embodiment, a single signal line between or within a device shown in the figures represents multiple interconnections, signal lines or a bus.

In an embodiment, interconnect DQ is a bidirectional bus in which signals can transfer in different directions on a single signal line. In an alternate embodiment, interconnect DQ is a unidirectional bus in which signals can transfer in only one direction on a single signal line. In still a further embodiment, interconnect DQ is a combination of unidirectional and bidirectional buses. In an embodiment, master device 301 is also coupled to memory modules 310 and 320 by a serial interconnect or bus.

In an embodiment, memory devices 311 and 312 are coupled to a printed circuit board or card including a plurality of signal lines or traces that may be used as interconnect DQ or as a part of interconnect DQ. Likewise, a plurality of signal lines or traces may be used as a part of an interconnect RQ and/or a serial interconnect.

In an embodiment, values 301a representing when respective output drivers are turned-on are provided to respective control registers, such as control register 260, in respective integrated circuit memory devices of system 300. In an embodiment, a value representing when to turn-on an output driver is provided for a group of integrated circuit memory devices or a memory module. In an embodiment, values 301a are provided during an initialization sequence or during a calibration mode that may occur during initialization or power-up of system 300.

Figure 4:
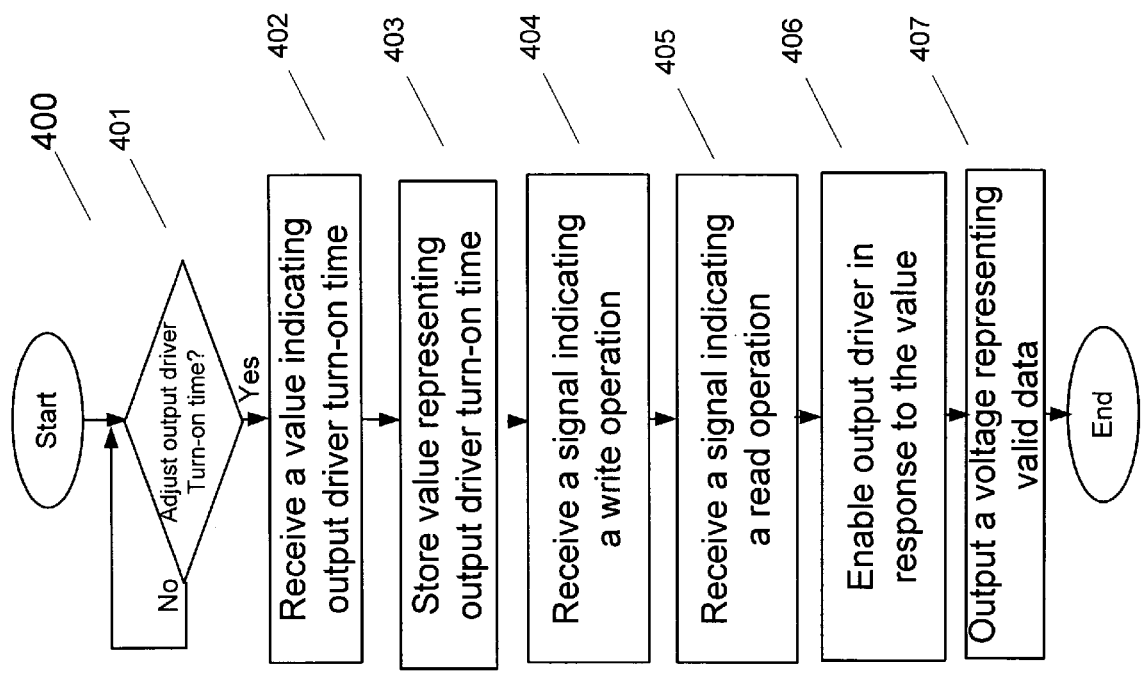
FIG. 4 illustrates a method 400 for enabling an output driver according to an embodiment.

FIG. 4 illustrates a method 400 embodiment for programming or adjusting when an output driver is turned-on. In alternate embodiments of the present invention, steps or logic blocks illustrated in FIG. 4 are carried out by hardware, software or a combination thereof. In alternate embodiments, the circuit devices illustrated in FIGS. 2a, 2b and 3 carry out the steps illustrated in FIG. 4. As one of ordinary skill in the art would appreciate, other steps that are not shown may be included in various embodiments of the present invention. Also, while method 400 is described in sequential steps, one of ordinary skill in the art would appreciate that method steps or logic blocks of method 400 are completed very quickly or almost instantaneously.

FIG. 4 illustrates a method 400 that begins at logic block 401 where a determination is made whether to adjust when to enable the operation of an output driver (or turn-on) in an integrated circuit, such as an integrated circuit memory device. In an embodiment, the determination is made during an initialization or power-up mode, or alternatively during an output driver calibration mode determined by a master device, in particular control software of a master device. If an output driver turn-on time is to be altered, control transitions to logic block 402 where a value indicating or representing when an output driver is to be turned-on is received. In an embodiment, an integrated circuit memory device 311 receives the value from master device 301 on interconnect DQ as illustrated by FIG. 3. In logic block 403, the value indicating an output driver turn-on time is stored, such as stored in a control register 260 in an integrated circuit memory device 311. In logic block 404, a signal indicating a write operation, such as a write command to an integrated circuit memory device, is received. In logic block 405, a signal indicating a read operation, such as a read command to an integrated circuit memory device, is received. An output driver is enabled or turned-on in response to the value indicating or representing when an output driver is turned-on as illustrated by logic block 406. A voltage representing valid data is then output from an output driver as illustrated by logic block 407. In an embodiment, a differential voltage value is output from an output driver of an integrated circuit memory device. Method 400 then ends.

In alternate embodiments, a value indicating a settling amount of time or time interval Ts (as illustrated in FIG. 1) for an output driver, rather than a value indicating a turn-on time or when to enable an output driver, is stored or programmed. The settling amount of time (or just "settling time") may be expressed in terms of clock cycles of the clock signal clk. The value indicating the settling amount of time may be represented in terms of a divisor of the clock signal clk.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described circuits may be processed by a processing entity (e.g., one or more processors) within the computer system in conjunction with execution of one or more other computer programs including, without limitation, netlist generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An integrated circuit memory device comprising:
   an output driver including a first contact and a second contact, wherein the first contact is to be coupled to a bidirectional interconnect, and wherein the second contact is to be coupled to the bidirectional interconnect; and
   a first register to store a value that represents an amount of time from when the output driver is in an operational state to when the output driver begins to output valid read data, wherein the output driver is to begin to output valid read data at the first and second contacts in the form of a differential signal.

2. The integrated circuit memory device of claim 1, further including a second register to store a value that represents an amount of time from when a signal indicating a read operation is received to when the output driver is in the operational state.

3. The integrated circuit memory device of claim 2, wherein the signal indicating a read operation is a read command.

4. A memory system, comprising:
a bidirectional interconnect;
an integrated circuit memory device coupled to the interconnect, the integrated circuit memory device including,
a plurality of contacts including a first contact and a second contact, wherein the first contact is coupled to the bidirectional interconnect, and wherein the second contact is coupled to the bidirectional interconnect,
an output driver to output valid read data in response to a read command, wherein the valid read data is output using a predetermined voltage level on the first contact, wherein the output driver is to begin to output valid read data at the first and second contacts in the form of a differential signal; and
a register to store a value that represents an amount of time from when the output driver is in an operational state to when the output driver begins to output valid read data at the predetermined voltage level; and a memory controller, coupled to the interconnect, to provide the read command.

5. The system of claim 4, further including a register disposed on the integrated circuit memory device, to store a value that represents an amount of time from when a signal indicating a read operation is received by the integrated circuit memory device to when the output driver is in the operational state.

6. The system of claim 5, wherein the integrated circuit memory device receives a clock signal, wherein the amount of time is expressed in terms of a number of clock cycles of the clock signal and the output driver outputs the valid read data synchronously with respect to the external clock signal.

7. The system of claim 5, wherein the integrated circuit memory device is one of a plurality of integrated circuit memory devices coupled to a substrate of a memory module.

8. A method of operation in an integrated circuit memory device that includes an output driver, wherein the method comprises:
storing a value representing an amount of time from when the output driver is in an operational state to when the output driver begins to output valid read data;
receiving a signal indicating that the memory device perform a read operation;
enabling the operation of the output driver at a time that corresponds to the value; and
outputting a voltage at a predetermined value representing valid read data after the output driver is in the operational state, wherein the outputting further includes outputting a differential voltage signal from a first contact and a second contact of the integrated circuit memory device, wherein the first contact is to be coupled to a bidirectional interconnect, and wherein the second contact is to be coupled to the bidirectional interconnect.

9. The method of claim 8, further comprising:
storing a value representing an amount of time from when the integrated circuit memory device is in an operational state to when the outputting the voltage at the predetermined value occurs.

10. The method of claim 8, wherein the signal indicating that the integrated circuit memory device perform the read operation is a read command.

11. The method of claim 8, further including receiving an external clock signal, wherein the amount of time from when the output driver is in the operational state to when the output driver begins to output valid read data is expressed in terms of clock cycles of the external clock signal.

12. Machine-readable media including information that represents an apparatus, the represented apparatus comprising:
an output driver including a first contact and a second contact, wherein the first contact is to be coupled to a bidirectional interconnect, and wherein the second contact is to be coupled to the bidirectional interconnect, wherein the output driver is to begin to output valid read data at the first and second contacts in the form of a differential signal; and
a register to store a value that represents an amount of time from when the output driver is in an operational state to when the output driver begins to output valid read data.

13. An integrated circuit memory device comprising:
an output driver including a first contact and a second contact, wherein the first contact is to be coupled to a bidirectional interconnect, and wherein the second contact is to be coupled to the bidirectional interconnect, wherein the output driver is to begin to output valid read data at the first and second contacts in the form of a differential signal; and
means for adjusting an amount of time from when the output driver is in an operational state to when the output driver begins to output valid read from the integrated circuit memory device.

14. An integrated circuit memory device comprising:
a first register to store a first value that is representative of a number of clock cycles of a clock signal to transpire between receiving a read command and enabling an output driver for operation; and
a second register to store a second value that is representative of a number of clock cycles of the clock signal to transpire between receiving the read command and outputting data in response to the read command, wherein outputting the data occurs after the enabling the output driver for operation,
wherein the data is to be output in the form of a differential signal at a first contact and a second contact, wherein the first contact is to be coupled to a bidirectional interconnect, and wherein the second contact is to be coupled to the bidirectional interconnect.

15. The integrated circuit memory device of claim 14, wherein the first and second values are stored in response to a command that specifies loading the first register with the first value and loading the second register with the second value.

16. The integrated circuit memory device of claim 14, wherein the integrated circuit memory device includes an array of dynamic memory cells.

* * * * *